(12) United States Patent
Rovedo et al.

(10) Patent No.: US 6,403,482 B1
(45) Date of Patent: Jun. 11, 2002

(54) SELF-ALIGNED JUNCTION ISOLATION

(75) Inventors: Nivo Rovedo, LaGrangeville, NY (US); Chung Hon Lam, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 09/605,726

(22) Filed: Jun. 28, 2000

(51) Int. Cl.[7] ............................................. H01L 21/302
(52) U.S. Cl. ...................... 438/689; 438/692; 438/719; 438/723
(58) Field of Search ................................. 438/244, 248, 438/387, 689, 706, 692, 593, 719, 723; 437/52, 35, 38, 47, 60

(56) References Cited

U.S. PATENT DOCUMENTS

| | | | | |
|---|---|---|---|---|
| 4,826,781 A | * | 5/1989 | Asahina et al. ................ 437/41 |
| 5,366,914 A | * | 11/1994 | Takahashi et al. ............. 437/41 |
| 5,416,348 A | * | 5/1995 | Jeng ............................ 257/297 |
| 5,429,978 A | * | 7/1995 | Lu et al. ........................ 437/52 |
| 5,521,111 A | * | 5/1996 | Sato ............................. 437/52 |
| 5,741,735 A | * | 4/1998 | Violette et al. .............. 438/279 |
| 6,071,783 A | * | 6/2000 | Liang et al. ................. 438/301 |

* cited by examiner

Primary Examiner—Benjamin L. Utech
Assistant Examiner—Duy-Vu Deo
(74) Attorney, Agent, or Firm—Eric W. Petraske

(57) ABSTRACT

Transistors having self-aligned dielectric layers under the source/drain contacts are formed by constructing transistors up to the LDD implant; etching STI oxide selective to Si and nitride to form a self-aligned contact recess; depositing an insulating layer in the bottom of the contact recess; recessing the insulating layer to leave room for a conductive contact layer; depositing the contact layer to make contact on a vertical surface to the Si underneath the gate sidewalls; recessing the contact layer; forming interlayer dielectric and interconnect to complete the circuit.

6 Claims, 2 Drawing Sheets

SELF-ALIGNED JUNCTION ISOLATION

FIELD OF THE INVENTION

The field of the invention is integrated circuit processing, in particular low-capacitance high speed circuits.

BACKGROUND OF THE INVENTION

It is well known in the field that junction capacitance between sources and drains (S/D) and the substrate is an important limiting factor in circuit performance. Also, leakage current between S/D and substrate results in power consumption without benefit.

Silicon on insulator technology has less junction capacitance than bulk technology because the buried insulator reduces the capacitance, but is more expensive.

It is desirable to develop a low-capacitance transistor structure for bulk silicon integrated circuits that is economical to manufacture.

SUMMARY OF THE INVENTION

The invention relates to a transistor structure in which a layer of insulator is placed under the transistor contacts to reduce capacitance between the source/drain and the silicon substrate.

A feature of the invention is the formation of a self-aligned contact pad electrically connected to the portion of the source and drain normally found under the sidewall spacers adjacent to the gate sidewalls.

DESCRIPTION OF THE PREFERRED EMBODIMENT

Figure 2:
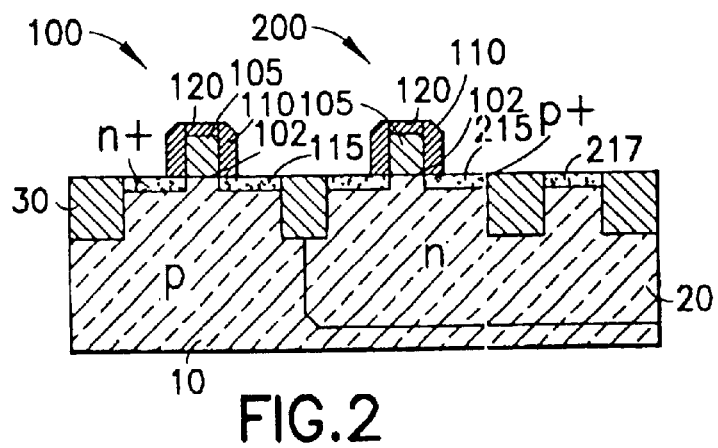
FIGS. 2–6 show intermediate steps in the process.

Referring now to FIG. 2, there is shown in cross section, a p-type silicon substrate 10 containing an n-well 20. Another substrate material, such as silicon-germanium (SiGe) may be used. An NFET 100 is to be constructed on the left of the figure, and a PFET 200 is to be constructed on the right. In referring to the two FETs, the same numerals will be used for the same elements in both transistors and numerals differing by 100 (105, 205) will be used for elements that are similar.

At the upper left of FIG. 2, shallow trench isolation (STI) members 30 isolate the transistors (and other elements), defining a set of transistor areas that will contain the transistors. In this embodiment, STI members 30 are formed conventionally from deposited oxide, planarized by chemical-mechanical polishing (CMP) to the level of the silicon surface.

Transistor 100 includes a gate stack comprising gate electrode 105 above gate dielectric 102, topped with dielectric (nitride, $Si_3N_4$) gate cap layer 120. Conventional sidewalls 110 partly cover a region 115 in which whatever S/D engineering is needed for the devices, e.g. low-doped or extensions, has been implemented. The S/D has undergone the low-level doping step in standard transistor formation before the sidewall formation, but not the high-level doping step. Transistor 200 is the same, except for standard doping changes (source/drains 215 are $p^+$) and optional change in gate polarity. Up to this point, the processing has been conventional, except that gate cap 120 is about 100 nm of nitride instead of the more typical thickness of about 20–70 nm of oxide. Conductive member 217 on the right has been implanted at the same time as the LDD implant dose that is primarily directed at S/D 115. In the illustrative case, member 217 will be used as a well contact. Member 217 is also implanted n-type.

Figure 3:
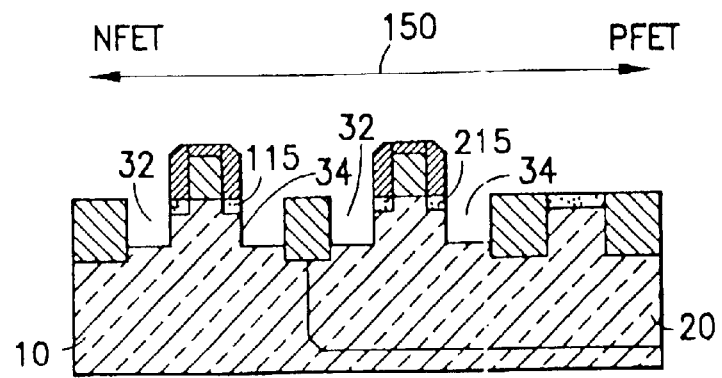

FIG. 3 shows the result of a first etching step to form a self-aligned recess that will contain the transistor contacts. A Si etching process selective to nitride and oxide ($SiO_2$), illustratively HBr, Cl, or $SF_6$ chemistry, has etched contact recess apertures 32 on opposite sides of the gate stack down into the Si to an illustrative depth of about 120 nm (for a contact thickness of about 60 nm). Note that the recesses are self-aligned to the gate stack and the STI because of the etch selectivity. During this etching step, interconnect member 217 was protected by conventional resist to prevent etching. Arrow 150 denotes the exposed area that is etched. Advantageously, alignment of the resist is noncritical because the amount of the STI members exposed does not matter.

Figure 4:
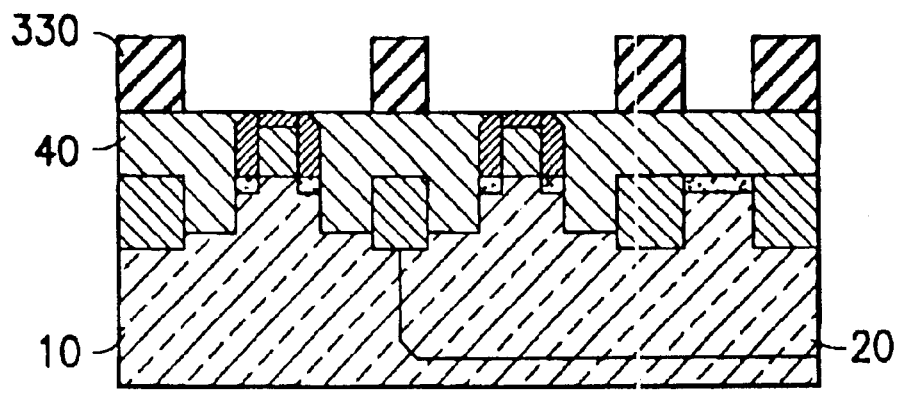

Next, FIG. 4 shows the result of depositing a layer of isolation dielectric 40, illustratively the same TEOS oxide as is in the STI, in the contact recess apertures and planarizing it in a CMP operation, stopping on the gate cap dielectric 120. A layer of resist 330 has been deposited and patterned to protect portions of layer 40 above STI 30.

Figure 5:
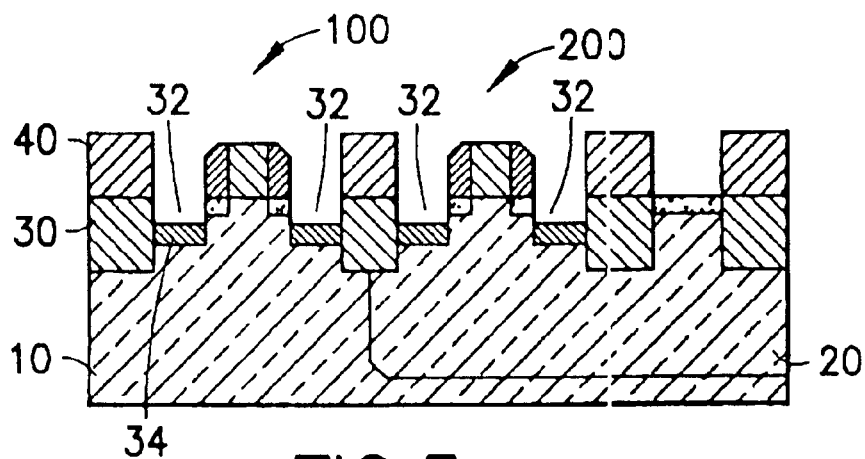

FIG. 5 shows the result after the next step, in which layer 40 has been etched (selective to nitride and Si) down to the substrate and below it, forming contact recesses 32 on opposite sides of each transistor and self-aligned between the transistor and the STI. The contact recesses have a depth such that there is a thick enough layer of oxide 34 to form an isolation member to reduce capacitance, and there is a large enough vertical junction contact area 35 on the vertical wall of the silicon underneath the gate sidewall to provide a good contact between the lightly doped (LDD) portion of the silicon under the sidewall (115, 215) and the junction contact member that will be deposited in the contact recess. Optionally, a conventional cleaning step plus a light oxide etch can be used to ensure provide good contact between the contact and the LDD source/drain. When this etching step is carried out between two diffusion regions separated by STI, it provides a recess region in the STI that will subsequently be filled with conductive material, providing a local interconnect between diffusions.

Figure 6:
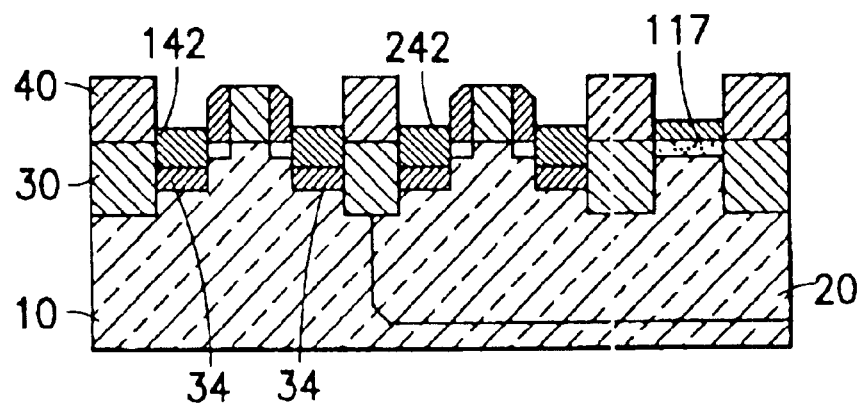

Next, in FIG. 6 is shown the result of depositing a conductive contact material 50 such as polysilicon (or amorphous Si, or low temperature, ultra-high vacuum SiGe), performing a CMP to the level of the gate cap and etching the deposited material down to slightly above the STI surface. The result is a set of contact members 142, 242 that are electrically connected to the remainder of S/D 115 and 215 and are isolated from the substrate by the oxide isolation members 34. This etch should be selective to oxide and nitride, illustratively HBR, Cl or $SF_6$ chemistry. The amount of conductive material 50 remaining above the nominal STI surface will be sufficient to allow for process variation and to leave a layer embedded in the STI regions to provide an interconnect. The nitride gate cap can be removed to allow doping of the gate electrode in the next step. This could result in spacer removal, which may require a second spacer formation process prior to silicide formation.

The contact members 42, interconnect and well contact 217 (and potential gate electrode) are implanted with an $N^+$ or $p^+$ dose as in conventional S/D formation. The nitride gate cap 120 is stripped (which may require a later spacer formation step) and the exposed silicon (the top of the gate electrode, the contact members and the interconnect and well contacts) are silicided in an optional step.

Figure 1:
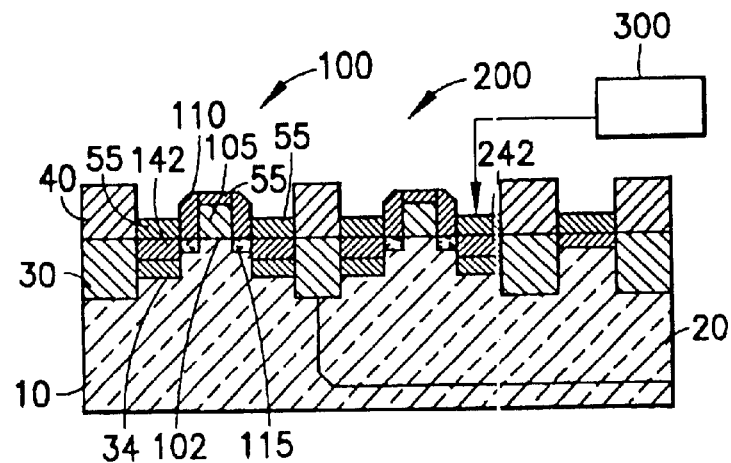
FIG. 1 shows the result of the inventive process.

Referring now to FIG. 1, there is shown the final structure, in which transistor 100 has gate 105 over gate dielectric 102, sidewalls 110, silicide cap 55, reduced S/D 115 and contact members 142 covered with silicide 55. The reduced S/D members are directly over the silicon substrate, but the contact members are placed above dielectric. Both the contact members and the silicide on top of them fill the space between the sidewalls and the STI. Transistor 200 has gate 105 over gate dielectric 102, sidewalls 110, silicide cap 55, S/D 215 and contact members 242 covered with silicide 55. Contact members 142 and 242 are structurally equivalent to raised sources and drains, with the added benefit of reduced capacitance and leakage to the substrate.

Conventional processing then completes the circuit by adding interconnects to other devices and interlayer dielectrics, denoted schematically by a box labeled 300.

While the invention has been described in terms of a single preferred embodiment, those skilled in the art will recognize that the invention can be practiced in various versions within the spirit and scope of the following claims. Various materials can be used for the substrate and for the conductive materials. Not all the polishing steps are required and some designers may decide to eliminate one or more of them, using etching to planarize and recess. The invention can be practiced on SOI substrates where the upper semiconductor device layer is required for some reason to be thicker than the depth of the sources and drains.

We claim:

1. A method of forming an integrated circuit comprising the steps of:

preparing a silicon substrate, including forming a set of STI members defining a set of transistor areas;

forming a gate stack comprising a gate dielectric, a gate electrode and a gate cap layer, forming gate sidewall spacers on said gate stack;

patterning a layer of resist to expose contact areas on opposite sides of said gate stack;

etching into said silicon substrate selective to said STI members and said sidewall spacers in an area bounded by said sidewall spacers and said STI members to form a set of self-aligned contact recess apertures;

depositing isolation dielectric in said contact recess apertures;

planarizing said isolation dielectric to the level of said gate stack;

etching said isolation dielectric, selective to said substrate material and to said sidewall spacers, to form an isolation member in the bottom of said contact recess apertures;

filling said contact recess apertures with conductive material;

planarizing said conductive material to the level of said gate stack; etching said conductive material selective to said isolation dielectric and said sidewall spacers to leave a set of contact members in said contact recess apertures; and completing said circuit.

2. A method of forming an integrated circuit according to claim 1, in which sources and drains are formed in said transistors before the formation of said sidewalls;

said step of forming said contact recess apertures exposes junction contact areas on the wall of said contact recess apertures abutting transistor sources and drains under said sidewalls, whereby said conductive material is in electrical contact with said sources and drains.

3. A method of forming an integrated circuit according to claim 2, further including a step of patterning photoresist before a step of forming sources and drains to define a set of local interconnect members by etching additional contact recess apertures into at least one STI member disposed between at least two contact members.

4. A method of forming an integrated circuit according to claim 2, in which said substrate contains a well of opposite polarity;

further including a step of patterning photoresist before a step of forming sources and drains to define a set of well contact members; and protecting said set of local interconnect members during said step of etching said contact recess apertures.

5. A method of forming an integrated circuit according to claim 2, in which said STI members and said isolation dielectric are oxide, said gate cap layer is nitride and said conductive material is selected from the group of silicon and Silicon-germanium.

6. A method of forming an integrated circuit comprising the steps of:

preparing a silicon substrate, including forming a set of STI members defining a set of transistor areas;

forming a gate stack comprising a gate dielectric, a gate electrode and a dielectric gate cap layer;

forming gate sidewall spacers on said gate stack;

patterning a layer of resist to expose junction areas on opposite sides of said gate stack;

etching into said silicon substrate selective to said STI members and said sidewall spacers in an area bounded by said sidewall spacers and said STI to form a set of contact recess apertures;

depositing isolation dielectric in said contact recess apertures and planarizing said isolation dielectric using said gate stack as a polish stop;

etching said isolation dielectric, selective to said substrate material and to said sidewall spacers, to form an isolation member in the bottom of said contact aperture;

filling said contact apertures with conductive material;

polishing said conductive material down to said gate cap layer;

etching said conductive material selective to said isolation dielectric and said sidewall spacers;

removing said gate cap layer; and completing said circuit.

* * * * *